United States Patent
Chindo

(10) Patent No.: US 8,633,773 B2
(45) Date of Patent: Jan. 21, 2014

(54) GAS CELL UNIT, ATOMIC OSCILLATOR AND ELECTRONIC APPARATUS

(75) Inventor: Koji Chindo, Saitama (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/418,642

(22) Filed: Mar. 13, 2012

(65) Prior Publication Data
US 2012/0235754 A1 Sep. 20, 2012

(30) Foreign Application Priority Data
Mar. 14, 2011 (JP) ................... 2011-055657

(51) Int. Cl.
*H01S 1/06* (2006.01)
*H03B 17/00* (2006.01)
*H03L 7/26* (2006.01)

(52) U.S. Cl.
USPC ............................. 331/94.1; 331/3

(58) Field of Classification Search
USPC .................................. 331/94.1, 3
See application file for complete search history.

(56) References Cited

U.S. PATENT DOCUMENTS

| | | | |
|---|---|---|---|
| 5,387,881 A * | 2/1995 | Schweda et al. | 331/94.1 |
| 6,806,784 B2 | 10/2004 | Hollberg et al. | |
| 6,812,800 B2 * | 11/2004 | Matsuura et al. | 331/94.1 |
| 2006/0002276 A1 | 1/2006 | Maruyama et al. | |
| 2006/0022761 A1 | 2/2006 | Abeles et al. | |
| 2009/0315629 A1 | 12/2009 | Chindo et al. | |

FOREIGN PATENT DOCUMENTS

| JP | 10-284772 | 10/1998 |
|---|---|---|
| JP | 2010-028794 | 2/2010 |

* cited by examiner

*Primary Examiner* — Joseph Chang
(74) *Attorney, Agent, or Firm* — Harness, Dickey & Pierce, P.L.C.

(57) ABSTRACT

A gas cell unit has a gas cell, inside which a gaseous alkali metal atom is sealed, a heater that heats the gas cell. The heater includes a heating resistor including a plurality of band-like portions so as to be parallel to each other. By making the directions of electric current flowing through two band-like portions adjacent to each other opposite to each other, it is possible to mutually offset or alleviate the magnetic fields generated along with the electric conduction to the plurality of band-like portions.

8 Claims, 11 Drawing Sheets

GAS CELL UNIT, ATOMIC OSCILLATOR AND ELECTRONIC APPARATUS

BACKGROUND

1. Technical Field

The present invention relates to a gas cell unit, an atomic oscillator, and an electronic apparatus.

2. Related Art

Generally, atomic oscillators, which oscillate based on the energy transfer of the atoms of an alkali metal such as rubidium and cesium, are broadly classified into an oscillator which uses a double resonance phenomenon due to light and microwaves (for example, see JP-A-10-284772) and an oscillator which uses a quantum interference effect (CPT: Coherent Population Trapping) due to two types of lights having different wavelengths (for example, see U.S. Pat. No. 6,806,784).

In any atomic oscillator, generally, in order to seal the alkali metal in a gas cell together with a buffer gas and keep the alkali metal in a gaseous state, there is a need to heat the gas cell to a predetermined temperature.

For example, in the atomic oscillator described in U.S. Patent Publication No. 2006-0022761, a membranous heating element formed of an ITO is provided on an outer surface of a gas cell, inside which gaseous metallic atoms are sealed, and the heating element is heated by electric conduction. As a result, it is possible to heat the gas cell and keep the metallic atoms in the gas cell in a gaseous state.

In such an atomic oscillator, generally, the electric current to be supplied to the heating element is regulated so that the temperature in the gas cell is constant. For that reason, for example, along with outdoor air temperature variations, the electric current flowing through the heating element is changed.

In this manner, when the electric current flowing through the heating element is changed, the magnetic field generated from the heating element is also changed. In the atomic oscillator of the related art, the magnetic field generated from the heating element is extensively applied into the gas cell. Thus, when the magnetic field generated from the heating element is changed, the frequency corresponding to the energy difference between the ground levels of the metallic atoms in the gas cell fluctuates. For that reason, in the atomic oscillator of the related art, there is a problem in that the output frequency deviates.

SUMMARY

An advantage of some aspects of the invention is to provide a gas cell unit, an atomic oscillator, and an electronic apparatus capable of improving frequency accuracy.

APPLICATION EXAMPLE 1

This application example of the invention is directed to a gas cell unit that includes a gas cell; and a first heater which heats the gas cell, wherein the first heater includes a first band-like portion and a second band-like portion provided parallel to each other and a configuration in which the first band-like portion and the second band-like portion are connected to each other, and the direction of electric current flowing through the first band-like portion is opposite to the direction of electric current flowing through the second band-like portion.

According to the gas cell unit configured in this manner, even when the amount of electric conduction to a heater (specifically, a heating resistor) is changed, it is possible to suppress or prevent a change in magnetic field in the gas cell. For that reason, it is possible to keep the temperature in the gas cell at a desired temperature while suppressing a change in magnetic field in the gas cell. As a consequence, it is possible to improve the frequency accuracy of the atomic oscillator.

APPLICATION EXAMPLE 2

It is preferable that the gas cell unit of the application example of the invention includes a second heater having the same configuration as that of the first heater and have a configuration in which the gas cell is interposed between the first heater and the second heater.

According to the gas cell unit configured in this manner, even when the amounts of electric conduction to the first heater and the second heater (specifically, heating resistors) are changed, respectively, it is possible to suppress or prevent a change in magnetic field in the gas cell. For that reason, it is possible to keep the temperature in the gas cell at a desired temperature while suppressing a change in magnetic field in the gas cell. As a consequence, the gas cell unit of the application example of the invention is able to improve the frequency accuracy.

APPLICATION EXAMPLE 3

In the gas cell unit of the application example of the invention, it is preferable that the first heater or the second heater have a plurality of the first band-like portions and the second band-like portions, the first band-like portion and the second band-like portion be alternately arranged.

As a result, it is possible to effectively mutually offset or alleviate the magnetic field generated due to the electric conduction to the first band-like portion and the magnetic field generated due to the electric conduction to the second band-like portion.

APPLICATION EXAMPLE 4

In the gas cell unit of the application example of the invention, it is preferable that the shape of the configuration, in which the first band-like portion and the second band-like portion are connected to each other, form a serpentine shape.

As a result, a wiring for the electric conduction to the heating resistor can be simplified.

APPLICATION EXAMPLE 5

In the gas cell unit of the application example of the invention, it is preferable that the first band-like portion and the second band-like portion be film-like heating resistors.

As a result, it is possible to simply form the heating resistors by various film forming methods with a high dimensional accuracy.

APPLICATION EXAMPLE 6

In the gas cell unit of the application example of the invention, it is preferable that the first band-like portion and the second band-like portion be bonded onto an insulating substrate provided separately from the gas cell.

As a result, it is possible to facilitate the installation of the heating resistor while preventing the short-circuiting of each portion of the heating resistor.

APPLICATION EXAMPLE 7

In the gas cell unit of the application example of the invention, it is preferable that the first band-like portion and the second band-like portion be bonded to an outer surface of the gas cell.

As a result, it is possible to reduce the distance between the heating resistor and the gas cell and effectively transmit heat from the heating resistor to the gas cell. Furthermore, it is possible to prevent a gap from being generated between the heating resistor and the gas cell. For that reason, it is possible to uniformly and effectively heat the gas cell.

APPLICATION EXAMPLE 8

This application example of the invention is directed to an atomic oscillator that includes the gas cell unit of the application example of the invention; a light emitting portion which emits an excitation light exciting alkali metal atoms in the gas cell; and a light detecting portion which detects an intensity of the excitation light transmitted through the gas cell.

As a result, it is possible to provide an atomic oscillator having excellent frequency accuracy.

APPLICATION EXAMPLE 9

This application example of the invention is directed to an electronic apparatus which includes the atomic oscillator according to the application example of the invention.

As a result, it is possible to provide an electronic apparatus having excellent reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a gas cell unit and an atomic oscillator of the invention will be described in detail based on embodiments shown in the accompanying drawings.

First Embodiment

Figure 1:
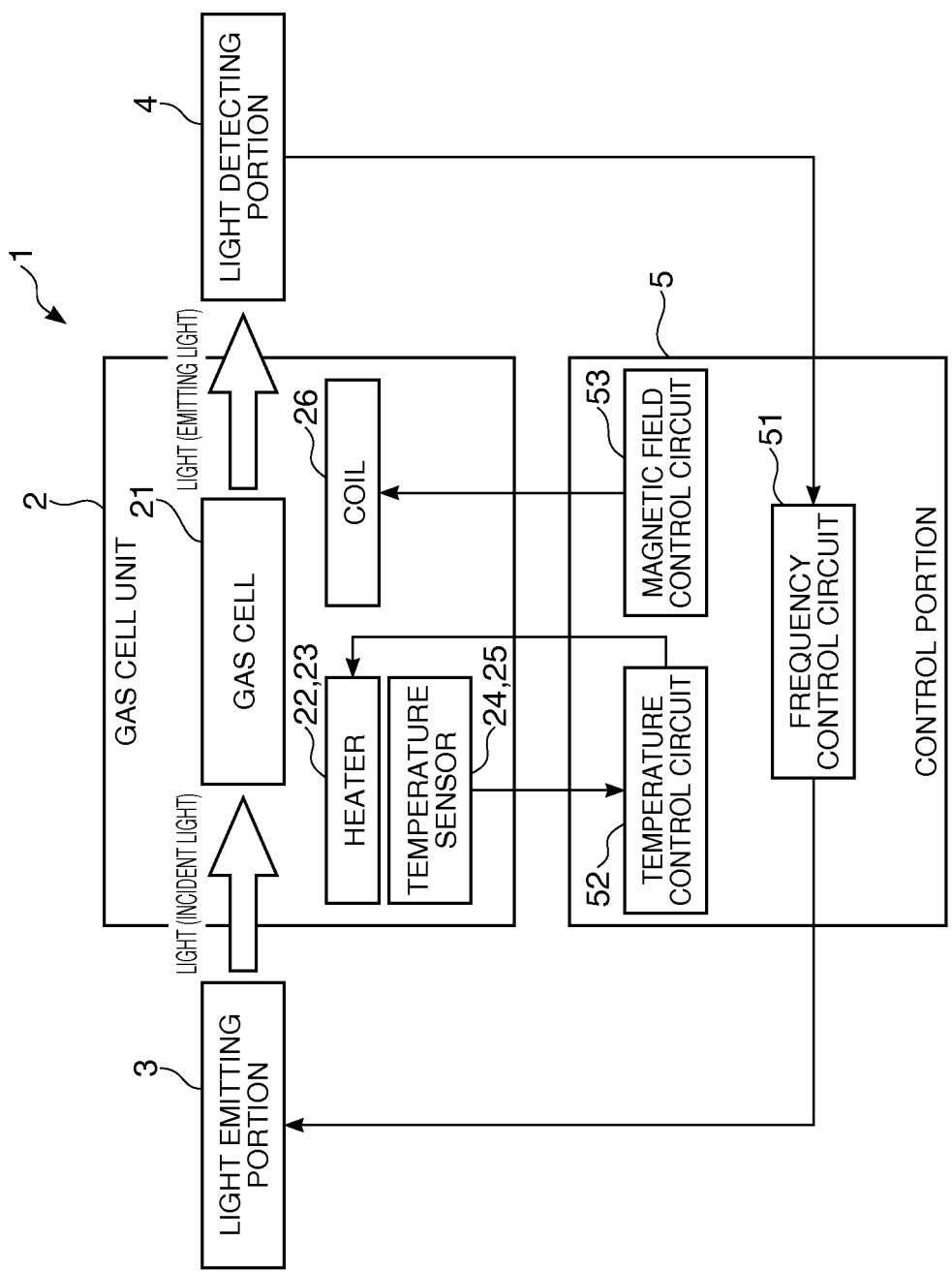
FIG. 1 is a block diagram that shows a schematic configuration of an atomic oscillator according to a first embodiment of the invention.
Figure 2:
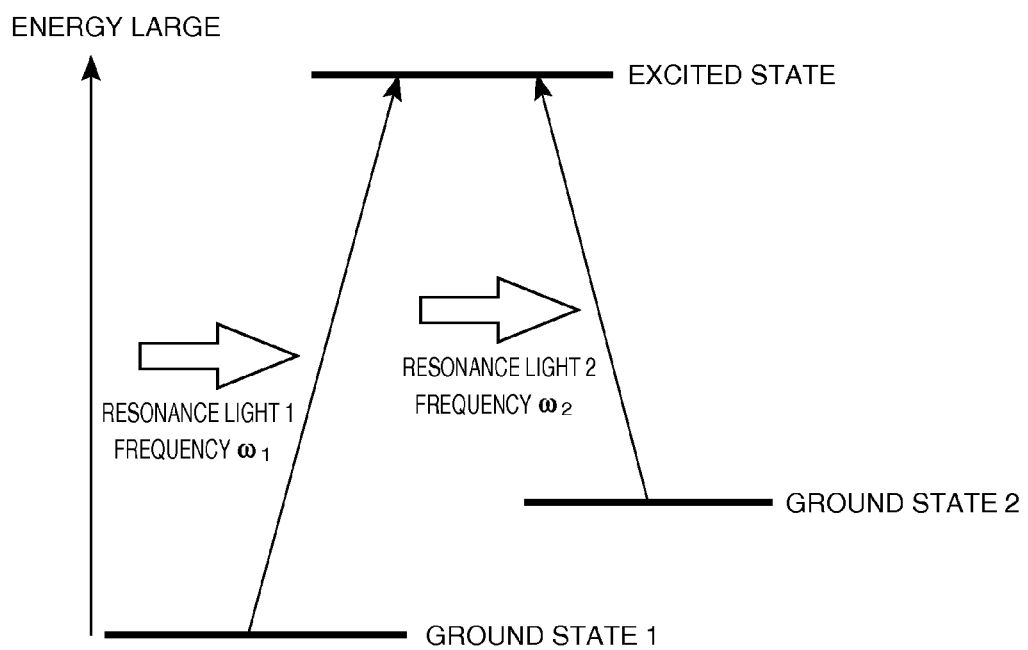
FIG. 2 is a diagram for describing the energy state of an alkali metal in a gas cell included in the atomic oscillator shown in FIG. 1.
Figure 3:
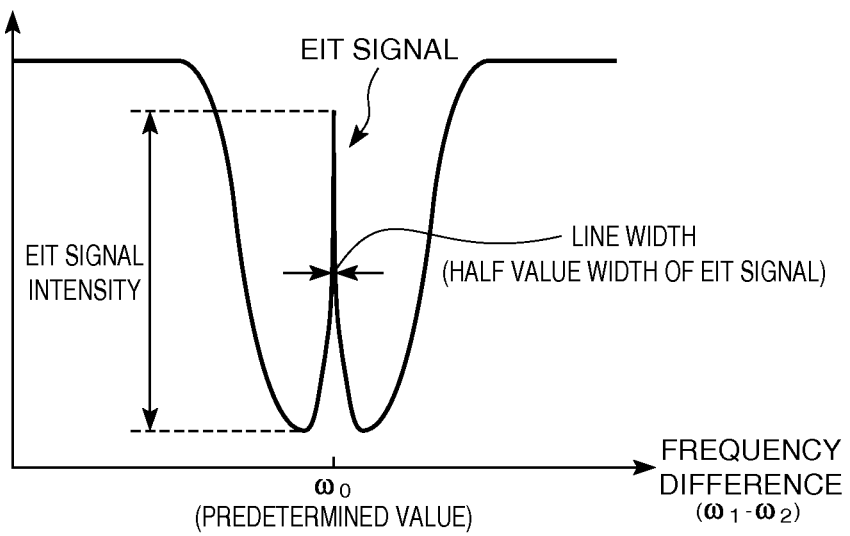
FIG. 3 is a graph that shows a relationship between a frequency difference of two lights from a light emitting portion and a detection intensity of the light detecting portion in the light emitting portion and the light detecting portion included in the atomic oscillator shown in FIG. 1.
Figure 4:
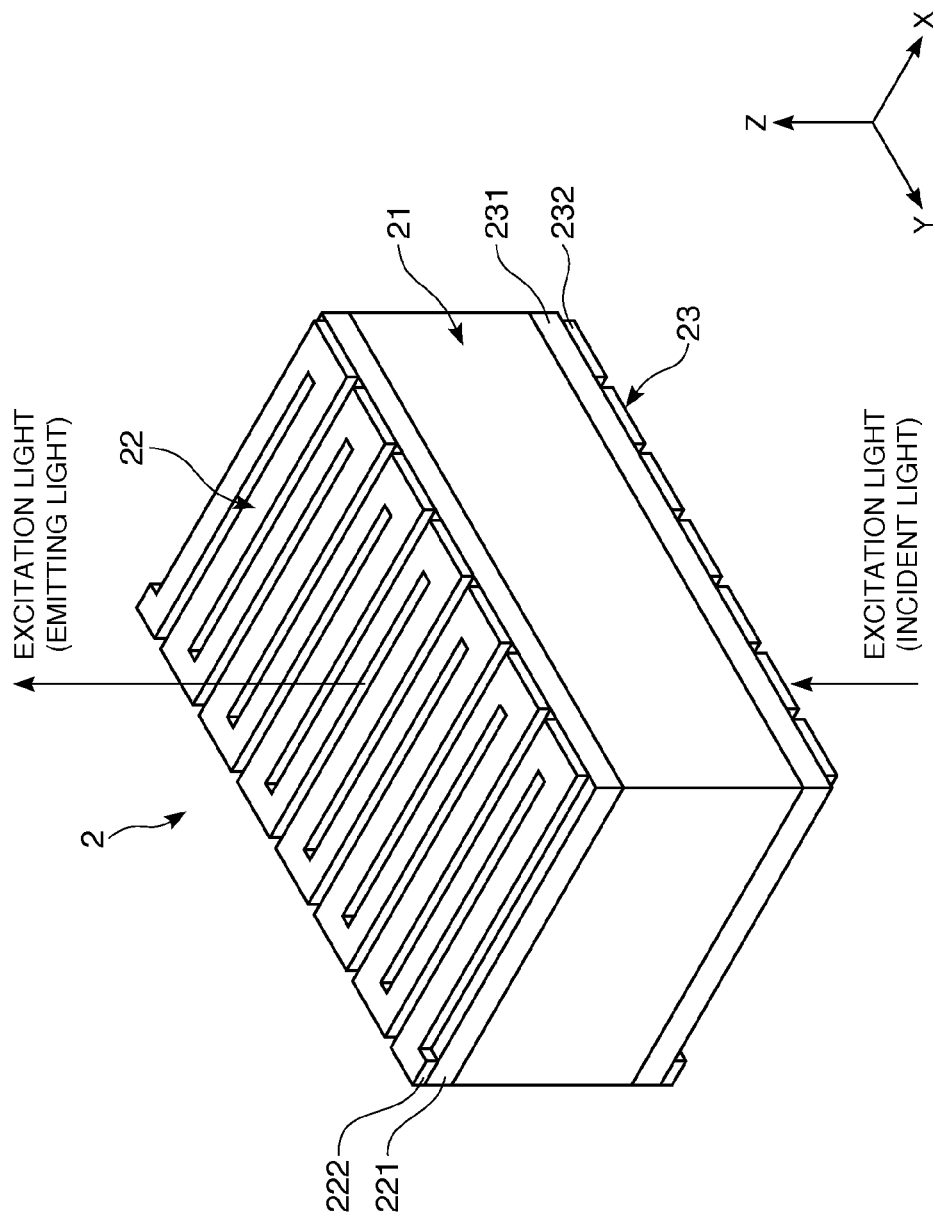
FIG. 4 is a perspective view that shows a schematic configuration of a gas cell unit included in the atomic oscillator shown in FIG. 1.
Figure 5:
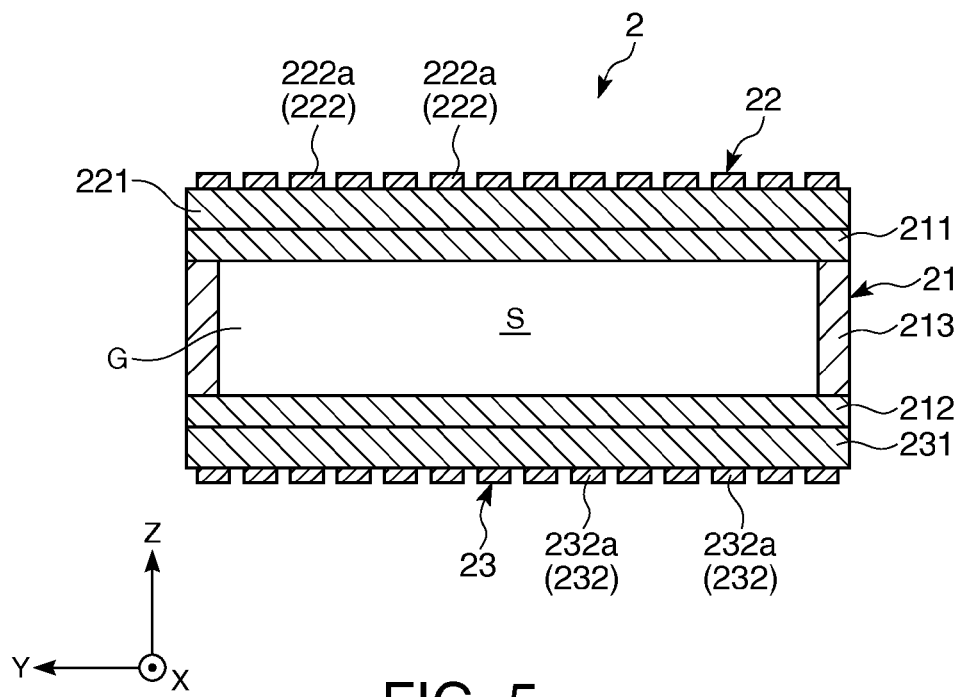
FIG. 5 is a cross-sectional view that shows the gas cell unit shown in FIG. 4.
Figure 6:
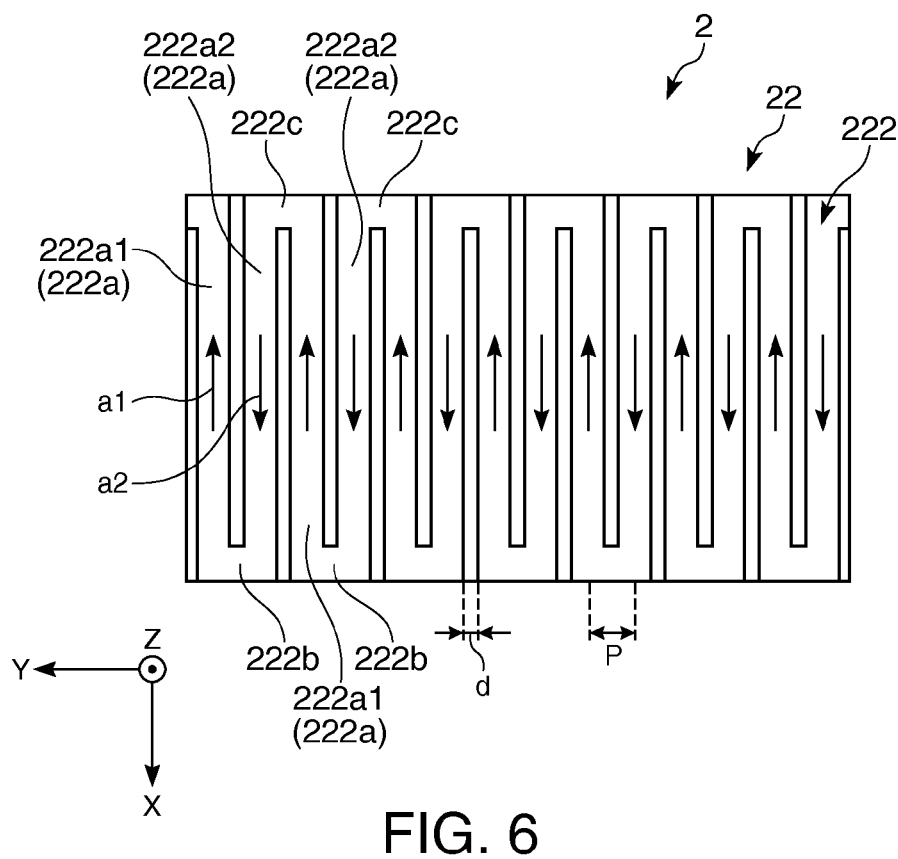
FIG. 6 is a diagram that shows a heating resistor included in the heater shown in FIG. 5.
Figure 7:
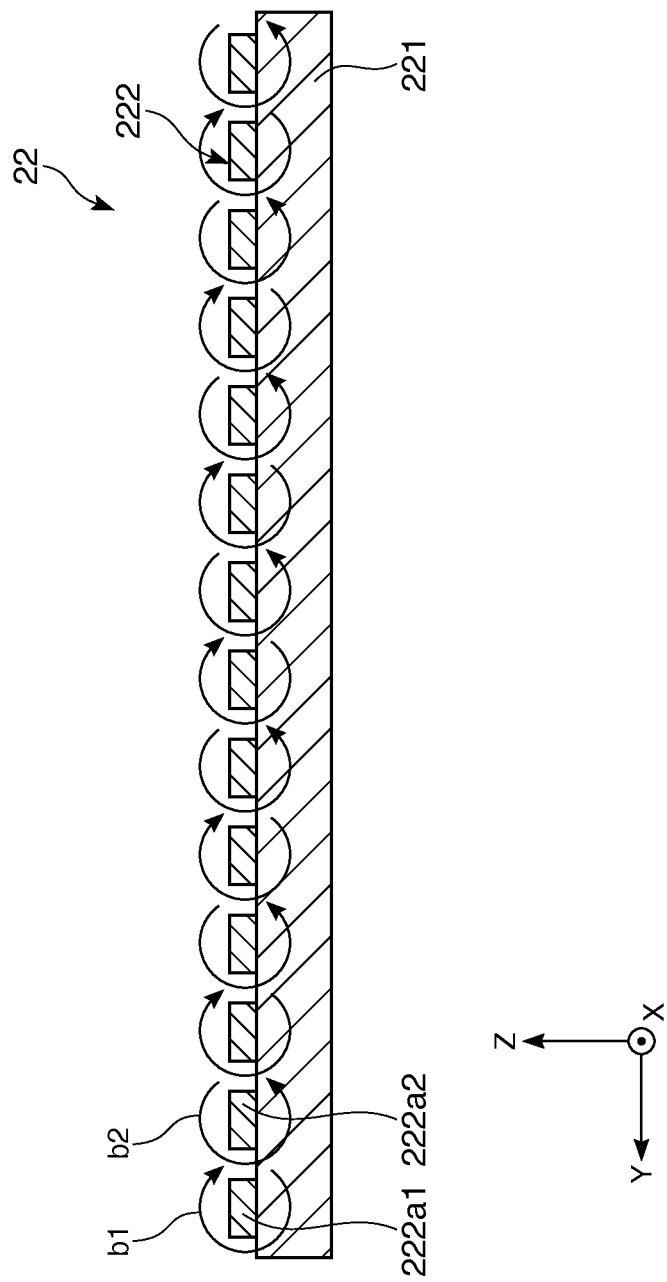
FIG. 7 is a diagram for describing the magnetic field generated due to the electric conduction to the heating resistor included in the heater shown in FIG. 5.

FIG. 1 is a block diagram that shows a schematic configuration of an atomic oscillator according to a first embodiment of the invention. FIG. 2 is a diagram for describing the energy state of an alkali metal in a gas cell included in the atomic oscillator shown in FIG. 1. FIG. 3 is a graph that shows a relationship between a frequency difference of two lights from a light emitting portion and a detection intensity of a light detecting portion in the light emitting portion and the light detecting portion included in the atomic oscillator shown in FIG. 1. FIG. 4 is a perspective view that shows a schematic configuration of a gas cell unit included in the atomic oscillator shown in FIG. 1. FIG. 5 is a cross-sectional view that shows the gas cell unit shown in FIG. 4. FIG. 6 is a diagram that shows a heating resistor included in the heater shown in FIG. 5. FIG. 7 is a diagram for describing the magnetic field generated due to the electric conduction to the heating resistor included in the heater shown in FIG. 5. In addition, hereinafter, for convenience of explanation, the upper side of FIGS. 4, 5 and 7 is "up" and the lower side thereof is "down". Furthermore, in FIGS. 4 to 7, for convenience of explanation, as three axes perpendicular to each other, an X axis, a Y axis and a Z axis are shown, the direction parallel to the X axis is the "X axis direction", the direction parallel to the Y axis is the "Y axis direction", and the direction (an up and down direction) parallel to the Z axis is the "Z axis direction".

Atomic Oscillator

Firstly, an overall configuration of the atomic oscillator according to the present embodiment will be briefly described based on FIGS. 1 to 3.

In addition, hereinafter, a case will be described as an example where the invention is applied to an atomic oscillator using a quantum interference effect. However, the invention can also be applied to an atomic oscillator using a double resonance effect, without being limited thereto.

The atomic oscillator 1 shown in FIG. 1 has a gas cell unit 2, a light emitting portion 3, a light detecting portion 4, and a control portion 5.

Furthermore, the gas cell unit 2 has a gas cell 21 sealed with a gaseous alkali metal, heaters 22 and 23 that heat the gas cell 21, temperature sensors 24 and 25 that detect the temperature of the gas cell 21, and a coil 26 that generates a magnetic field acting on the gas cell 21.

Alkali metals such as gaseous rubidium, cesium, and sodium are sealed in an inner portion of the gas cell 21.

As shown in FIG. 2, the alkali metal has an energy level of a three-level system, and obtains three states of two ground states (ground states 1 and 2) having different energy levels and an excited state. Herein, the ground state 1 has an energy state lower than that of the ground state 2.

When two types of resonance lights 1 and 2 having the different frequencies to the gaseous alkali metal are irradiated to the gaseous alkali metal as mentioned above, the optical absorptivity (an optical transmittance) in the alkali metal of the resonance lights 1 and 2 is changed depending on the difference ($\omega 1-\omega 2$) between a frequency $\omega 1$ of the resonance light 1 and a frequency $\omega 2$ of the resonance light 2.

Moreover, when the difference ($\omega 1-\omega 2$) between the frequency $\omega 1$ of the resonance light 1 and the frequency $\omega 2$ of the resonance light 2 coincides with the frequency corresponding to an energy difference between the ground state 1 and the ground state 2, excitations from the ground states 1 and 2 to the excited state are stopped, respectively. At this time, both of the resonance lights 1 and 2 are not absorbed by alkali metal but transmit the same. Such a phenomenon is called a CPT phenomenon or an electromagnetically induced transparency phenomenon (EIT: Electromagnetically Induced Transparency).

The light emitting portion 3 emits the excited light that excites alkali metal atoms in the gas cell 21.

More specifically, the light emitting portion 3 emits two types of lights (the resonance light 1 and the resonance light 2) having different frequencies as mentioned above.

The frequency $\omega 1$ of the resonance light 1 is able to excite the alkali metal in the gas cell 21 from the ground state 1 mentioned above to the excited state.

Furthermore, the frequency $\omega 2$ of the resonance light 2 is able to excite the alkali metal in the gas cell 21 from the ground state 2 mentioned above to the excited cite.

Furthermore, it is preferable that the excitation lights (the resonance lights 1 and 2) have coherency.

The light emitting portion 3 can be formed of, for example, a laser light source such as a semiconductor laser.

The light detecting portion 4 detects the intensities of the resonance lights 1 and 2 transmitted through the gas cell 21.

For example, if the light emitting portion 3 fixes the frequency $\omega 1$ of the resonance light 1 and changes the frequency $\omega 2$ of the resonance light 2, when the difference ($\omega 1-\omega 2$) between the frequency $\omega 1$ of the resonance light 1 and the frequency $\omega 2$ of the resonance light 2 coincides with a frequency $\omega 0$ corresponding to an energy difference between the ground state 1 and the ground state 2, as shown in FIG. 3, the detection intensity of the light detecting portion 4 steeply rises. The steep signal is detected as an EIT signal. The EIT signal has an eigenvalue defined by the kind of alkali metal. Thus, the oscillator can be configured by using such an EIT signal.

The light detecting portion 4 is constituted by, for example, an optical detector which outputs the detection signal depending on the intensity of the received light.

The control portion 5 has a function of controlling the heaters 22 and 23 and the light emitting portion 3.

The control portion 5 has a frequency control circuit 51 that controls the frequencies of the resonance lights 1 and 2 of the light emitting portion 3, a temperature control circuit 52 that controls the temperature of the alkali metal in the gas cell 21, and a magnetic field control circuit 53 that controls the magnetic field to be applied to the gas cell 21.

The frequency control circuit 51 controls the frequencies of the resonance lights 1 and 2 to be emitted from the light emitting portion 3 based on the detection result of the light detecting portion 4 mentioned above. More specifically, the frequency control circuit 51 controls the frequencies of the resonance lights 1 and 2 to be emitted from the light emitting portion 3 such that the difference ($\omega 1-\omega 2$) detected by the light detecting portion 4 mentioned above becomes the specific frequency $\omega 0$ of the alkali metal mentioned above.

Furthermore, the temperature control circuit 52 controls the electric conduction to the heaters 22 and 23 based on the detection result of the temperature sensors 24 and 25.

Furthermore, the magnetic field control circuit 53 controls the electric conduction to the coil 26 such that the magnetic field generated by the coil 26 is constant.

Gas Cell Unit

Next, the gas cell unit 2 will be described in detail.

As shown in FIG. 4, the gas cell unit 2 has a gas cell 21, and a pair of heaters 22 and 23 provided so as to interpose the gas cell 21 therebetween.

Gas Cell

As shown in FIG. 5, the gas cell 21 has a pair of plate-like portions 211 and 212, and a spacer 213 provided therebetween.

The plate-like portions 211 and 212 have transparency to the excitation light from the light emitting portion 3, respectively. In the present embodiment, the excitation light incident into the gas cell 21 is transmitted through the plate-like portion 212, and the excitation light emitted from the inner portion the gas cell 21 is transmitted through the plate-like portion 211.

In the present embodiment, each of the plate-like portions 211 and 212 forms a plate shape. Furthermore, each of the plate-like portions 211 and 212 forms a quadrangle in a plan view. In addition, for example, the shapes of the plate-like portions 211 and 212 may form a circular shape when seen in a plan view, without being limited to the shape mentioned above.

The material forming the plate-like portions 211 and 212 is not particularly limited if the same has transparency to the excitation light as mentioned above, but a glass material, crystal or the like are adopted.

Furthermore, the spacer 213 forms a space S between the pair of plate-like portions 211 and 212 mentioned above. The space S is sealed with the alkali metal as mentioned above.

In the present embodiment, the spacer 213 forms a frame shape or a cylindrical shape, and the inner periphery and the outer periphery thereof form a quadrangle, respectively, when seen in a plan view. In addition, the shape of the spacer 213 is not limited to the shape mentioned above, and, for example, the inner periphery and the outer periphery thereof may form a circular shape, respectively, when seen in a plan view.

Furthermore, the spacer 213 is bonded to the respective plate-like portions 211 and 212 in an airtight manner. As a result, it is possible to make the space S between the pair of plate-like portions 211 and 212 an airtight space. A bonding method of the spacer 213 and the respective plate-like portions 211 and 212 can be determined depending on the forming materials of the spacer 213 and the respective plate-like portions 211 and 212, and although the method is not particularly limited, for example, it is possible to use a bonding method by an adhesive, a direct bonding method, an anodic bonding method or the like.

A material forming the spacer 213 is not particularly limited, but a metallic material, a resin material or the like may be used, and like the plate-like portions 211 and 212, the glass material, crystal or the like may be used.

Heater

The heaters 22 and 23 have a function of heating the gas cell 21 (more specifically, the alkali metal in the gas cell 21). As a result, the vapor pressure of the alkali metal in the gas cell 21 is kept so as to be equal to or greater than a predetermined pressure value, whereby the desired amount of alkali metal can be maintained in a gaseous state.

In the present embodiment, the heaters 22 and 23 are provided so as to interpose the gas cell 21 therebetween. Furthermore, the heaters 22 and 23 are configured so as to be vertically symmetrical to each other via the gas cell 21. In addition, the heaters 22 and 23 may be configured so as to be vertically asymmetrical to each other via the gas cell 21. Furthermore, for example, the heaters 22 and 23 may be configured so as to be rotationally symmetrical around the axis parallel to the Y axis centered on the gas cell 21.

The heater 22 has a substrate 221 and a heating resistor (a first heating resistor) 222 provided on one surface (an upper surface in FIG. 5) of the substrate 221.

Similarly, the heater 23 has a substrate 231 and a heating resistor (a first heating resistor) 232 provided on one surface (a lower surface in FIG. 5) of the substrate 231.

Hereinafter, the respective portions of the heater 22 will be described in detail. In addition, the configuration of the heater 23 is the same as that of the heater 22, and thus the description thereof will be omitted.

In the present embodiment, the substrate 221 forms a quadrangle (more specifically, a rectangle) when seen in plan view. In addition, the shape of the substrate 221 when seen in plan view is not limited to a rectangle, but may be other quadrangles such as a square, a ridge shape, and a trapezoid, may be other polygons such as a triangle and a pentagon, and may be a circular shape, an oval shape, an irregular shape or the like.

The substrate 221 has transparency to the excitation light that excites the alkali metal atom in the gas cell 21. As a result, the heater 22 can be provided on an optical path (specifically, on the emitting portion of the excitation light of the outer surface of the gas cell 21) of the excitation light to effectively heat the alkali metal in the optical path of the excitation light by the heater 22. In addition, in the present embodiment, as shown in FIG. 4, the excitation light is incident into the gas cell 21 via the heater 23, and is emitted from the gas cell 21 via the heater 22.

Furthermore, the substrate 221 has insulating properties. As a result, it is possible to prevent short-circuiting of each portion of the heating resistor 222. Furthermore, by forming the heating resistor 222 on the substrate 221 provided separately from the gas cell 21, the installation of the heating resistor 222 can be facilitated.

The forming material of the substrate 221 is not particularly limited as long as the material has insulating properties and the optical transparency as mentioned above and is able to withstand the heating of the heating resistor 222, but, for example, the glass material, crystal or the like can be used.

Furthermore, the thickness of the substrate 221 is not particularly limited, but, for example, is about 0.001 to 10 mm.

The surface of the gas cell 21 side of the substrate 221 comes into contact with the gas cell 21. In addition, the substrate 221 and the gas cell 21 may or may not be bonded to each other. Furthermore, a layer such as a bonding layer for bonding and a heat conducting layer of a high heat conductance may be interposed between the substrate 221 and the gas cell 21. However, the layer such as the bonding layer and the heat conducting layer needs to have transparency to the excitation light.

Furthermore, the heating resistor (the first heating resistor) 222 is bonded to a surface of the substrate 221 opposite to the gas cell 21.

The heating resistor 222 is heated by electric conduction. In the present embodiment, since the heating resistor (the first heating resistor) 222 is bonded to the surface of the substrate 221 opposite to the gas cell 21, heat from the heating resistor 222 is transmitted to the gas cell 21 via the substrate 221. At that time, since heat from the heating resistor 222 is suitably diffused in a plane direction of the substrate 221 in the substrate 221, even if a pattern of the heating resistor 222 described later is rough (more specifically, for example, even if the distance between the band-like portions 222a is long), the gas cell 21 can be uniformly heated.

Furthermore, in the present embodiment, the heating resistor 222 has transparency to the excitation light that excite the alkali metal atom in the gas cell 21. As a result, it is possible to effectively heat the alkali metal in the optical path of the excitation path by the heater 22 by providing the heater 22 in the emitting portion of the excited light of the outer surface of the gas cell 21.

Particularly, the heating resistor 222 is configured so as to prevent or suppress the magnetic field generated along with the electric conduction leaking to the outside. As a result, even when the amount of electric conduction to the heating resistor 222 fluctuates, a change in magnetic field in the gas cell 21 can be suppressed or prevented. For that reason, the temperature in the gas cell 21 can be kept at a desired temperature, while suppressing a change in magnetic field in the gas cell 21. As a consequence, the frequency accuracy of the atomic oscillator 1 can be improved.

To describe specifically, as shown in FIG. 6, the heating resistor 222 forms a serpentine shape. As a result, the electric conduction path (the path through which electric current flows) of the heating resistor 222 makes it possible to prevent or suppresses the magnetic field generated along with the electric conduction from leaking to the outside, and it is possible to simplify the wiring for the electric conduction to the heating resistor 222. In addition, the wiring for the electric conduction to the heating resistor 222 is not particularly limited, but, for example, a bonding wire, a flexible print substrate or the like can be used. Furthermore, a part of the wiring of the electric conduction to the heating resistor 222 may be formed on the side surface of the substrate 221 and the side surface of the gas cell 21.

The heating resistor 222 includes a plurality of band-like portions 222a and a plurality of connection portions 222b and 222c.

Each of the plurality of band-like portions 222a has a reed shape (a rectangular shape), is extended in the X axis direction, respectively, and is provided so as to be parallel to each other at intervals.

Furthermore, in the present embodiment, a width (a length in the Y axis direction) of the plurality of band-like portions 222a is equal to each other. Furthermore, the width of each band-like portion 222a can be determined depending on the thickness, the heating amount, the amount of electric conduction, the forming material, the resistance value or the like of the band-like portion 222a, and is not particularly limited, but, is about, for example, 0.01 mm or more and 10 mm or less. In addition, the widths of the plurality of band-like portions 222a may be different from each other.

Furthermore, in the present embodiment, the plurality of band-like portions 222a is provided at equal pitches. Furthermore, the pitch P of the plurality of band-like portions 222a is not particularly limited, but is preferably smaller than the width of the band-like portion 222a, and is preferably as small as possible the insulating properties between the band-like portions 222a can be ensured. In addition, the plurality of band-like portions 222a may be provided at unequal pitches.

The plurality of band-like portions 222a are configured so that one end portions and the other end portions of two band-like portions 222a adjacent to each other are alternately connected to each other via the connection portions 222b and 222c. As a result, the heating resistor 222 forms a serpentine shape.

As shown in FIG. 6, in the heating resistor 222, when causing the electric current to flow from one end portion (the left side end portion of FIG. 6) to the other end portion (the right end portion of FIG. 6), the direction of the electric current flowing though the plurality of band-like portions 222a sequentially and alternately reversed from one end portion side toward the other end portion side. That is, the heating resistor 222 includes a plurality of band-like portions 222a1 in which the electric current flows in a −X direction, and a plurality of band-like portions 222a2 in which the electric current flows in the +X direction, in the plurality of band-like portions 222a, and the band-like portion 222a1 and the band-like portion 222a2 are alternately arranged in a row in the Y axis direction.

In this manner, the heating resistor 222 is able to make the direction (a direction shown by an arrow a1 in FIG. 6) of the electric current flowing through the band-like portion 222a1 (the first band-like portion) opposite to the direction (a direction shown by an arrow a2 in FIG. 6) of the electric current flowing through the band-like portion 222a2 (the second band-like portion). As a result, as shown in FIG. 7, it is possible to make the direction (a direction shown by an arrow b1 of FIG. 7) generated along with the electric conduction to the band-like portion 222a1 opposite to the direction (a direction shown by an arrow b2 of FIG. 7) generated along with the electric conduction to the band-like portion 222a2. As a consequence, it is possible to mutually offset or alleviate the magnetic field generated along with the electric conduction to the band-like portion 222a1 and the magnetic field generated along with the electric conduction to the band-like portion 222a2.

For that reason, even if the amount of electric conduction to the heater 22 (specifically, the heating resistor 222) is changed, the fluctuation of the magnetic field in the gas cell 21 can be suppressed or prevented. For that reason, it is possible to keep the temperature in the gas cell 21 at a desired temperature while suppressing a change in magnetic field in the gas cell 21. As a consequence, the frequency accuracy of the atomic oscillator 1 can be improved.

Furthermore, in the present embodiment, as mentioned above, since the band-like portion 222a1 (the first band-like portion) and the band-like portion 222a2 (the second band-like portion) are alternately arranged in a row, it is possible to mutually effectively offset or alleviate the magnetic field generated along with the electric conduction to the band-like portion 222a1 and the magnetic field generated along with the electric conduction to the band-like portion 222a2.

In addition, any one band-like portion of the band-like portion 222a1 (the first band-like portion) and the band-like portion 222a2 (the second band-like portion) is a resistor (a conductor) having a resistance value close to zero, and may be a band-like portion in which the heating due to the electric conduction is not nearly generated. For example, when the band-like portion 222a2 (the second band-like portion) is formed of a resistor (a conductor) having a resistance value close to zero, the band-like portion 222a2 substantially does not have a heating function, but, has a function of offsetting or alleviating the magnetic field and a function as a wiring for the electric conduction to the respective band-like portions 222a1. Furthermore, the directions (directions) of the electric current and the magnetic field shown in FIGS. 6 and 7 are an example, and for example, the directions (the same is also true for the directions of the arrows b1 and b2) of the arrows a1 and a2 may be opposite to those shown, without being limited thereto.

The heating resistor 222 forms a thin film state. As a result, it is possible to simply form the heating resistor 222 by various film forming methods with high dimensional accuracy.

The forming material of the heating resistor 222 is not particularly limited if the material is heated by the electric conduction and has the optical transparency to the excitation light as mentioned above. However, it is desirable to use a transparent electrode material such as an oxide such as ITO (Indium Tin Oxide), IZO (Indium Zinc Oxide), In3O3, SnO2, SnO2 containing Sb, and ZnO containing Al.

Such transparent electrode materials have suitable optical transparency and can be effectively heated by electric conduction.

Furthermore, when the heating resistor 222 is formed of the transparent electrode material, the heater 22 can be provided on the optical path of the excitation light. For that reason, it is possible to effectively heat the emitting portion of the excitation light of the gas cell 21 by the heater 22.

The thicknesses of the heating resistors 222 and 223 are not particularly limited, but, for example, are about 0.1 or more and 1 mm or less.

Furthermore, the forming material of the heating resistor 222 may constantly be formed of the same material, and a part thereof may be different from other portions.

Furthermore, the formation of the heating resistor 222 is not particularly limited, but, for example, can be formed by the use of a PVD method (physical vapor deposition method), a chemical deposition method (CVD) such as a plasma CVD and a thermal CVD, a dry plating method such as a vacuum vapor deposition, a sol-gel method or the like.

The heating resistor 222 is configured so that the one end portion and the other end portion are electrically connected to the temperature control circuit 52, and the voltage is applied between the one end portion and the other end portion. As a result, the plurality of band-like portions 222a is connected to the power source in series.

Temperature Sensor

Furthermore, the gas cell unit 2 has the temperature sensors 24 and 25. The heating values of the heater 22 and 23 as mentioned above are controlled based on the detection results of the temperature sensors 24 and 25. As a result, it is possible to keep alkali metal atoms in the gas cell 21 at a desired temperature.

The temperature sensor 24 detects the temperature of the heater 22 or the plate-like portion 211 of the gas cell 21. Furthermore, the temperature sensor 25 detects the temperature of the heater 23 or the plate-like portion 212 of the gas cell 21.

The installation positions of the temperature sensors 24 and 25 are not particularly limited. Although it is not shown, for example, in the temperature sensor 24, the installation position is on the heater 22 or on the vicinity of the plate-like portion 211 of the outer surface of the gas cell 21, and in the temperature sensor 25, the installation position is on the heater 23 or on the vicinity of the plate-like portion 212 of the outer surface of the gas cell 21.

As the temperature sensors 24 and 25, various known temperature sensors such as a thermistor and a thermocouple can be used, respectively, without being particularly limited.

The temperature sensors 24 and 25 are electrically connected to the temperature control circuit 52 mentioned above via a wiring (not shown).

Moreover, the temperature control circuit 52 controls the amount of electric conduction of the heater 22 based on the detection result of the temperature sensor 24. Furthermore, the temperature control circuit 52 controls the amount of electric conduction to the heater 23 based on the detection result of the temperature sensor 25.

In this manner, by controlling the amount of electric conduction to the heaters 22 and 23 using the two temperature sensors 24 and 25, more precise temperature control is possible. Furthermore, it is possible to prevent an irregularity (a temperature difference between the incident side and the emitting side of the excitation light) of the temperature in the gas cell 21.

Coil

Furthermore, the gas cell unit 2 has the coil 26 (see FIG. 1).

The coil 26 generates a magnetic field through electric conduction. As a result, by applying the magnetic field to the alkali metal in the gas cell 21, it is possible to expand the gap between the different degraded energy states of the alkali metal and improve the resolution. As a consequence, it is possible to increase the accuracy of the oscillation frequency of the atomic oscillator 1.

The installation position of the coil 26 is not particularly limited. Although not shown, the coil 26 may be provided to be wound along the outer periphery of the gas cell 21 so as to constitute a solenoid shape, and a pair of coils may face each other via the gas cell 21 so as to constitute a Helmholtz type.

The coil 26 is electrically connected to the magnetic field control circuit 53 mentioned above via a wiring (not shown). As a result, it is possible to supply the electricity to the coil 26.

The forming material of the coil 26 is not particularly limited, but, for example, silver, copper, palladium, platinum, gold or an alloy thereof are adopted, and one sort, or two or more sorts thereof can be used in a combined manner.

According to the gas cell unit 2 of the present embodiment as mentioned above, since the direction of the electric current flowing through the band-like portion 222a1 is opposite to the direction of the band-like portion 222a2, it is possible to mutually offset or alleviate the magnetic field generated along with the electric conduction of the band-like portion 222a1 and the magnetic field generated along with the electric conduction to the band-like portion 222a2. That is, the heating resistor 222 is configured so as to prevent or suppress the magnetic field generated along with the electric conduction leaking to the outside (more specifically, in the gas cell 21). Similarly, the heating resistor 223 is also configured so as to prevent or suppress the magnetic field generated along with the electric conduction leaking to the outside.

For that reason, even when the amount of electric conduction to the heaters 22 and 23 fluctuates, the fluctuation in magnetic field in the gas cell 21 can be suppressed or prevented. For that reason, the temperature in the gas cell 21 can be kept at a desired temperature while suppressing a change in magnetic field in the gas cell 21. As a consequence, the frequency accuracy of the atomic oscillator 1 can be improved.

Furthermore, according to the atomic oscillator 1 including the gas cell unit 2, excellent frequency accuracy is obtained.

Second Embodiment

Next, a second embodiment of the invention will be described.

Figure 8:
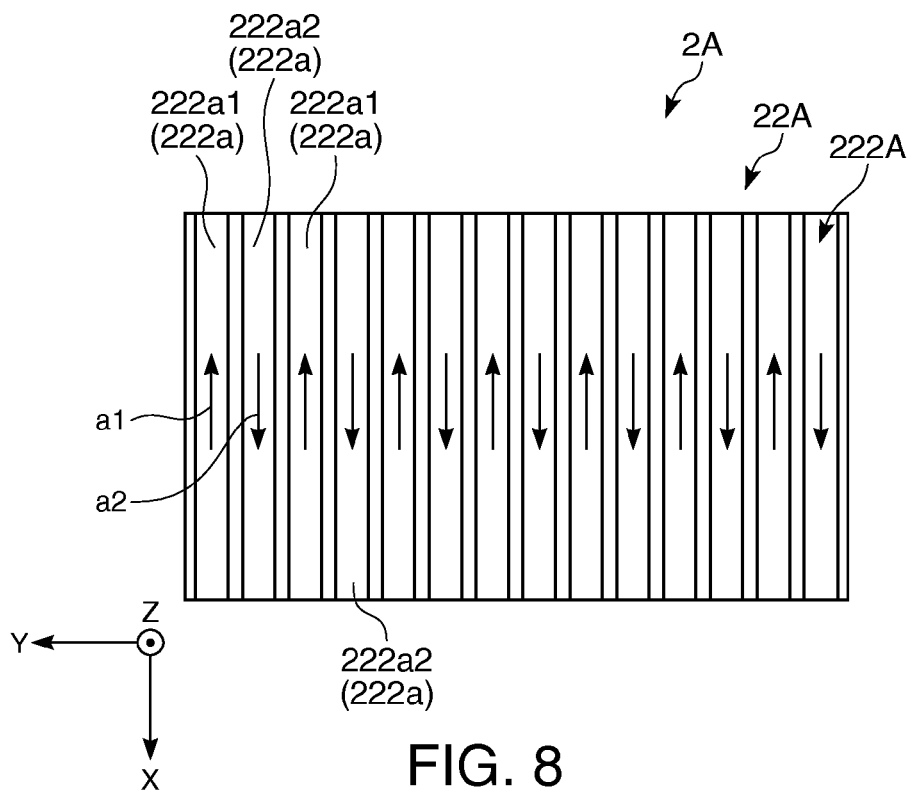
FIG. 8 is a diagram that shows a heater included in a gas cell unit according to a second embodiment of the invention.

FIG. 8 is a diagram that shows a heater included in a gas cell unit according to the second embodiment of the invention.

The gas cell unit according to the present embodiment is the same as that of the gas cell unit according to the first embodiment mentioned above except that the configuration (mainly a shape) of a heating resistor of the heater differs.

In addition, in the description mentioned below, differences between the gas cell unit of the second embodiment and that of the first embodiment will be mainly described, and similar matters are omitted. Furthermore, in FIG. 8, the same configurations as those of the embodiments mentioned above are denoted by the same reference numerals.

The gas cell unit 2A shown in FIG. 8 is configured so that, in the gas cell unit 2 of the first embodiment, a heater 22A is provided instead of the heater 22. In addition, although not shown, the gas cell unit 2A may be configured so that the gas cell unit 2 of the first embodiment is provided with the same heater as the heater 22A instead of the heater 23.

The heater 22A includes a heating resistor 222A heated by the electric conduction.

The heating resistor 222A includes a plurality of band-like portions 222a provided parallel to each other. That is, the heating resistor 222A is configured in the same manner that the connection portions 222b and 222c are omitted in the heating resistor 222 of the heater 22 of the first embodiment mentioned above.

Like the heating resistor 222 of the first embodiment, the heating resistor 222A is configured so that the direction of the electric current flowing through the band-like portion 222a1 (the first band like portion) is opposite to the direction of the electric current flowing through the band-like portion 222a2 (the second band-like portion).

Furthermore, the heating resistor 222A is configured so that the plurality of band-like portions 222a is connected to the power source in parallel and the voltage is applied between one end portion and the other end of each band-like portion 222a. As a result, the power source voltage can be suppressed.

The frequency accuracy can be improved by the gas cell unit 2A according to the second embodiment as described above.

Third Embodiment

Next, a third embodiment of the invention will be described.

Figure 9:
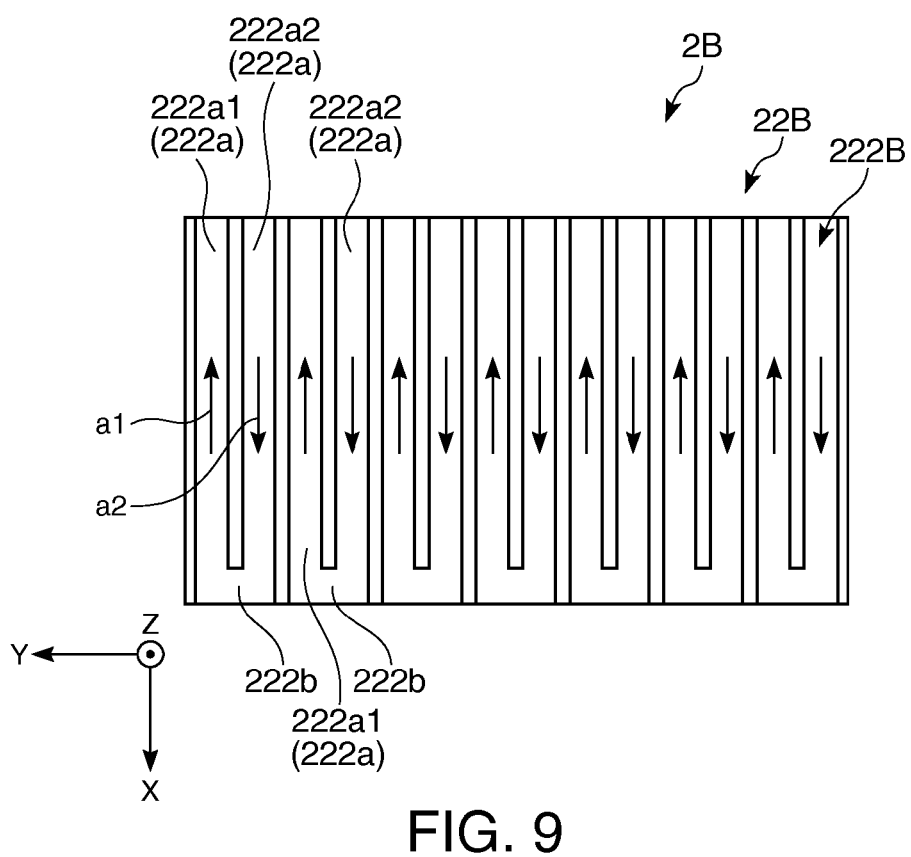
FIG. 9 is a diagram that shows a heater included in a gas cell unit according to a third embodiment of the invention.

FIG. 9 is a diagram showing a heater included in a gas cell unit according to the third embodiment of the invention.

The gas cell unit according to the present embodiment is the same as that of the gas cell unit according to the first embodiment mentioned above except that the configuration (mainly a shape) of a heating resistor of the heater differs.

In addition, in the description mentioned below, the differences between the gas cell unit of the third embodiment and that of the first embodiment will be mainly described, and similar matters are omitted. Furthermore, in FIG. 9, the same configurations as those of the embodiments mentioned above are denoted by the same reference numerals.

The gas cell unit 2B shown in FIG. 9 is configured so that the gas cell unit 2 of the first embodiment is provided with a heater 22B instead of the heater 22. In addition, although not shown, the gas cell unit 2B may be configured so that the gas cell unit 2 of the first embodiment is provided with the same heater as the heater 22B instead of the heater 23.

The heater 22B includes a heating resistor 222B heated by the electric conduction.

The heating resistor 222B includes a plurality of band-like portions 222a provided parallel to each other, and a plurality of connection portions 222b. That is, the heating resistor 222B is configured in the same manner that the connection portion 222c is omitted in the heating resistor 222 of the heater 22 of the first embodiment mentioned above.

Like the heating resistor 222 of the first embodiment, the heating resistor 222B is configured so that the direction of the electric current flowing through the band-like portion 222a1 (the first band like portion) is opposite to the direction of the electric current flowing through the band-like portion 222a2 (the second band-like portion).

The heating resistor 222B is able to perform the electric conduction from one end portion side (the upper side in FIG. 9) of the plurality of band-like portions 222a. For that reason, it is possible to simplify the wiring for the electric conduction to the heating resistor 222B compared to the wiring for the electric conduction to the heating resistor 222A of the second embodiment. Furthermore, the plurality of band-like portions 222a can be connected to the power source in parallel for each of two band-like portions 222a1 and 222a2 form a pair connected by the connection portion 222b. For that reason, the power source voltage can be suppressed compared to the first embodiment mentioned above.

The frequency accuracy can be improved by the gas cell unit 2B according to the third embodiment as mentioned above.

Fourth Embodiment

Next, a fourth embodiment of the invention will be described.

Figure 10:
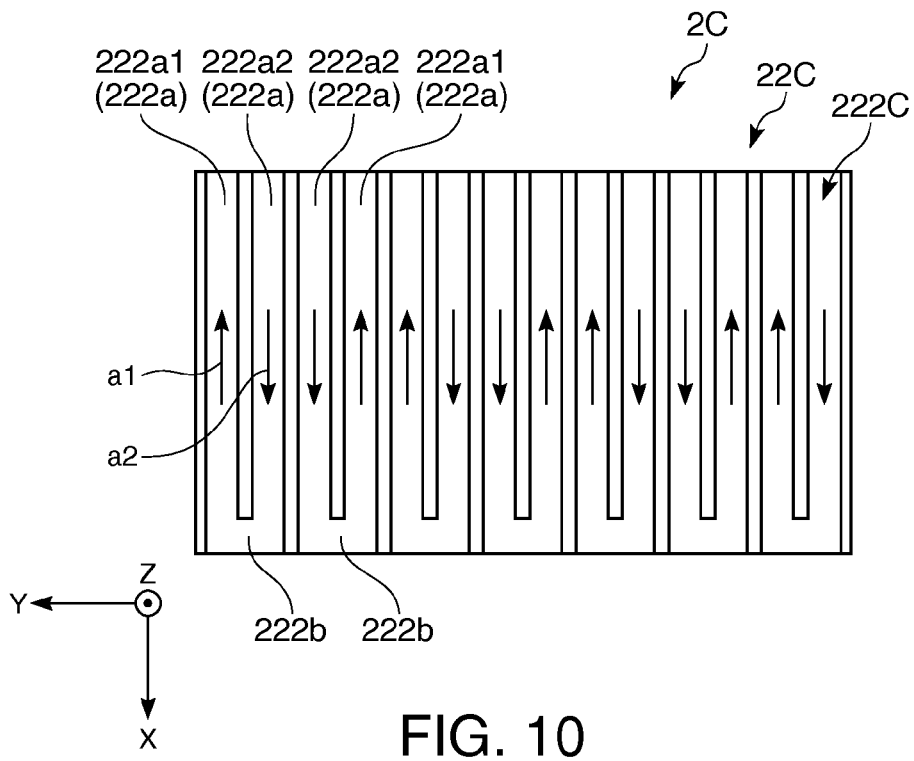
FIG. 10 is a diagram that shows a heater included in a gas cell unit according to a fourth embodiment of the invention.

FIG. 10 is a diagram showing a heater included in a gas cell unit according to the fourth embodiment of the invention.

The gas cell unit according to the present embodiment is the same as the gas cell unit according to the first embodiment mentioned above except that the configuration (mainly, a shape) of the heating resistor of the heater differs. In addition, in the description mentioned below, differences between the gas cell unit of the fourth embodiment and that of the first embodiment will be mainly described, and similar matters are omitted. Furthermore, in FIG. 10, the same configurations as those of the embodiments mentioned above are denoted by the same reference numerals.

The gas cell unit according to the present embodiment is the same as that of the gas cell unit according to the third embodiment mentioned above except that the method (a configuration of a wiring for electric conduction) of electric conduction to a heating resistor of the heater differs.

The gas cell unit 2C shown in FIG. 10 is configured so that the gas cell unit 2 of the first embodiment is provided with a heater 22C instead of the heater 22. In addition, although not shown, the gas cell unit 2C may be configured so that the gas cell unit 2 of the first embodiment is provided with the same heater as the heater 22C instead of the heater 23.

The heater 22C includes a heating resistor 222C heated by the electric conduction.

The heating resistor 222C includes a plurality of band-like portions 222a provided parallel to each other, and a plurality of connection portions 222b. That is, the heating resistor 222C forms the same shape as that of the heating resistor 222B of the heater 22B of the third embodiment mentioned above.

The heating resistor 222C is configured so that the directions of the electric current flowing through two band-like portions 222a (the band-like portion 222a1 and the band-like portion 222a2) forming a pair connected by the connection portion 222b are opposite to each other, but the directions of the electric current flowing through two band-like portions 222a (the band-like portions 222a1 and the band-like portions 222a2) adjacent to each other between two pairs are identical to each other.

The frequency accuracy can be improved by the gas cell unit 2C according to the fourth embodiment as mentioned above.

Fifth Embodiment

Next, a fifth embodiment of the invention will be described.

Figure 11:
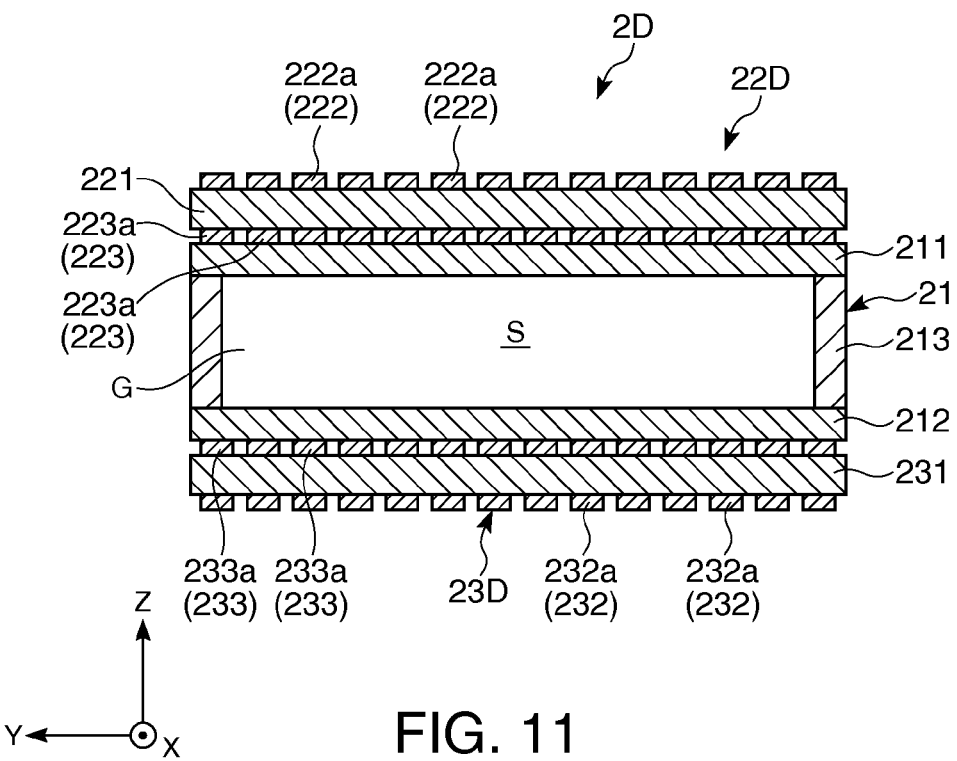
FIG. 11 is a cross-sectional view that shows a gas cell unit according to a fifth embodiment of the invention.

FIG. 11 is a cross-sectional view that shows a gas cell unit according to the fifth embodiment of the invention.

Figure 12A:
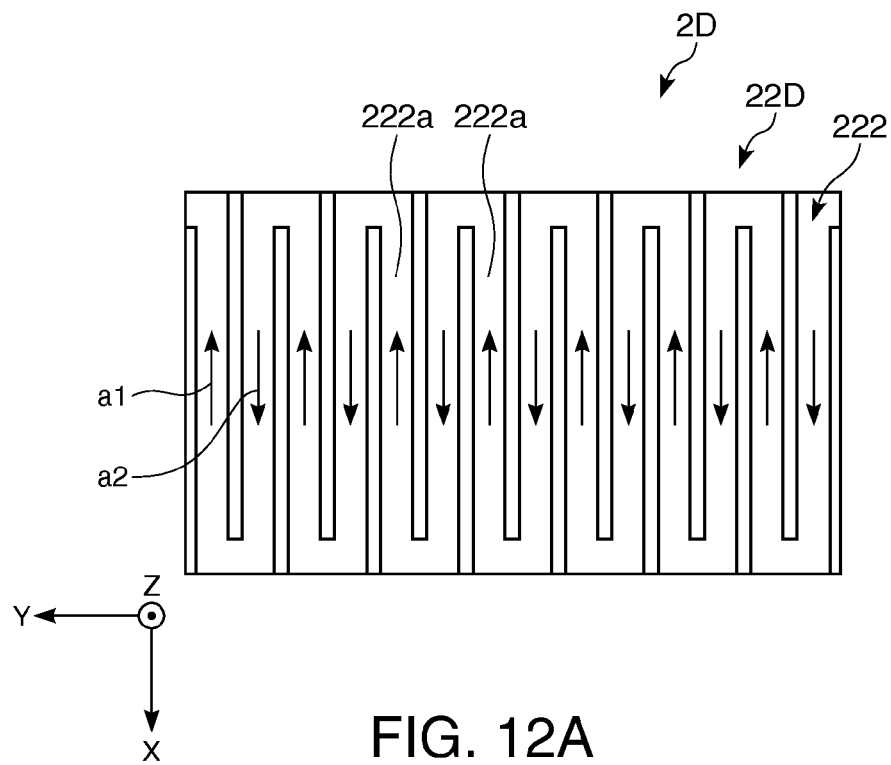
FIG. 12A is a diagram that shows a heating resistor (a first heating resistor) provided in one surface of a substrate of a heater shown in FIG. 11.
Figure 12B:
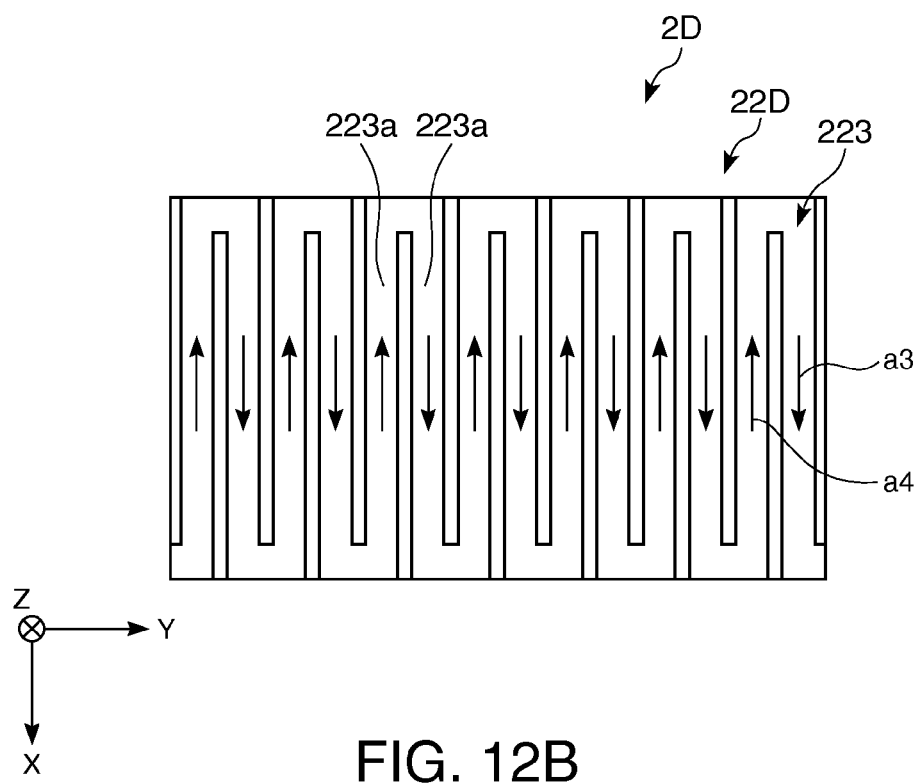
FIG. 12B is a diagram that shows a heating resistor provided in the other surface of a substrate of a heater shown in FIG. 11.

FIG. 12A is a diagram that shows a heating resistor (a first heating resistor) provided in one surface of a substrate of a heater shown in FIG. 11. FIG. 12B is a diagram that shows a heating resistor provided in the other surface of a substrate of a heater shown in FIG. 11.

The gas cell unit according to the embodiment is the same as that of the gas cell unit according to the first embodiment mentioned above except that the configuration of the heater differs.

In addition, in the description as below, differences between the gas cell unit of the fifth embodiment and that of the first embodiment will be mainly described, and descriptions of similar matters will be omitted. Furthermore, in FIGS. 11, 12A and 12B, the same configurations as those of the embodiments mentioned above are denoted by the same reference numerals.

A gas cell unit 2D shown in FIG. 11 has a gas cell 21, and a pair of heaters 22D and 23D provided so as to interpose the gas cell 21 therebetween.

The heater 22D has a substrate 221, a heating resistor (a second heating resistor) 222 provided at an opposite side of the gas cell 21 to the substrate 221, and a heating resistor (a first heating resistor) 223 provided at the gas cell 21 side to the substrate 221.

The heating resistor 223 has a plurality of band-like portions 223a provided in a row at intervals and has the same configuration as that of the heating resistor 222.

Since the heating resistor 223 is bonded to the surface of the substrate 221 of the gas cell 21 side, it is possible to reduce the distance between the heating resistor 223 and the gas cell 21 and effectively transmit heat from the heating resistor 223 to the gas cell 21. Furthermore, in the present embodiment, since the heating resistor 222 is also provided on the surface of the substrate 221 opposite to the gas cell 21, the heating amount of the heater 22 can be increased.

Similarly, the heater 23D has a substrate 231, a heating resistor (a second heating resistor) 232 provided at the side opposite to the gas cell 21 to the substrate 231, and a heating resistor (a first heating resistor) 233 provided at the gas cell 21 side to the substrate 231.

The frequency accuracy can be improved by the gas cell unit 2D according to the fifth embodiment as mentioned above.

Sixth Embodiment

Next, a sixth embodiment of the invention will be described.

Figure 13:
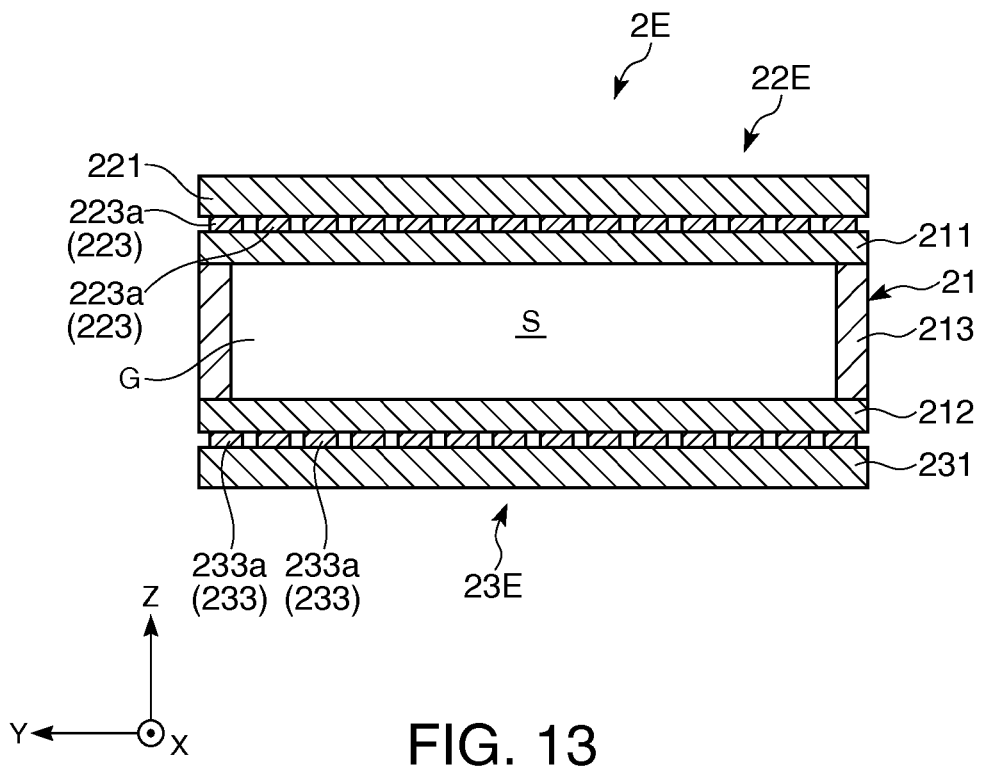
FIG. 13 is a cross-sectional view that shows a gas cell unit according to a sixth embodiment of the invention.

FIG. 13 is a cross-sectional view showing a gas cell unit according to the sixth embodiment of the invention.

The gas cell unit according to the embodiment is the same as that of the gas cell unit according to the first embodiment mentioned above except that the configuration of the heater differs. Furthermore, the gas cell unit according to the present embodiment is identical to the gas cell unit according to the fifth embodiment mentioned above except that the heating resistor provide on the surface of the substrate opposite to the gas cell is omitted.

In addition, in the description as below, differences between the gas cell unit of the sixth embodiment and that of the first embodiment will be mainly described, and descriptions of similar matters will be omitted. Furthermore, in FIG. 13, the same configurations as those of the embodiments mentioned above are denoted by the same reference numerals.

A gas cell unit 2E shown in FIG. 13 has a gas cell 21, and a pair of heaters 22E and 23E provided so as to interpose the gas cell 21 therebetween.

The heater 22E has a substrate 221, and a heating resistor 223 provided at the gas cell 21 side to the substrate 221. In other words, the heater 22E has the same configuration as that of both sides of the heater 22 of the first embodiment being reversed.

Similarly, the heater 23E has a substrate 231, and a heating resistor 233 provided at the gas cell 21 side to the substrate 231.

The frequency accuracy can be improved by the gas cell unit 2E according to the sixth embodiment as mentioned above.

Seventh Embodiment

Next, a seventh embodiment of the invention will be described.

Figure 14:
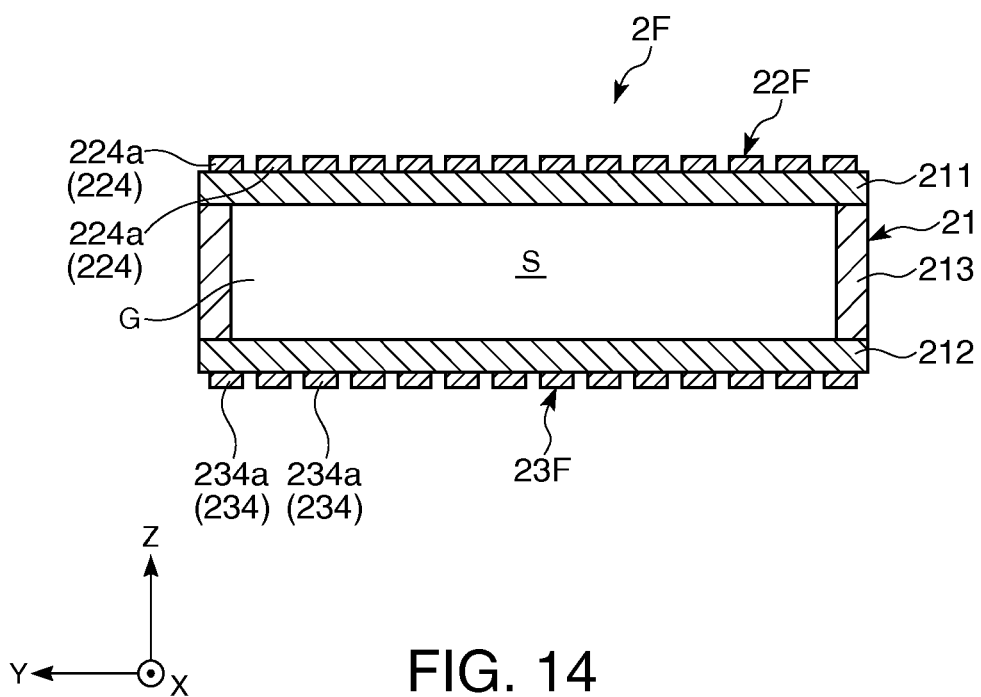
FIG. 14 is a cross-sectional view that shows a gas cell unit according to a seventh embodiment of the invention.

FIG. 14 is a cross-sectional that shows a gas cell unit according to the seventh embodiment of the invention.

The gas cell unit according to the present embodiment is the same as that of the gas cell unit according to the first embodiment mentioned above except that the configuration of the heater differs.

In addition, in the description as below, differences between the gas cell unit of the seventh embodiment and that of the first embodiment will be mainly described, and descriptions of similar matters will be omitted. Furthermore, in FIG. 14, the same configurations as those of the embodiments mentioned above are denoted by the same reference numerals.

A gas cell unit 2F shown in FIG. 14 has a gas cell 21, and a pair of heaters 22F and 23F provided so as to interpose the gas cell 21 therebetween.

The heater 22F has a heating resistor 224 bonded to the upper surface of the gas cell 21.

The heating resistor 224 is patterned like the heating resistor 222 of the first embodiment mentioned above.

Since the heating resistor 224 is bonded to the outer surface of the gas cell 21, it is possible to reduce the distance between the heating resistor 224 and the gas cell 21 and effectively transmit heat from the heating resistor 224 to the gas cell 21. Furthermore, it is possible to prevent a gap being generated between the heating resistor 224 and the gas cell 21. For that reason, the gas cell 21 can be uniformly and effectively heated.

Similarly, the heater 23F has a heating element 234 bonded to the lower surface of the gas cell 21.

Figure 15:
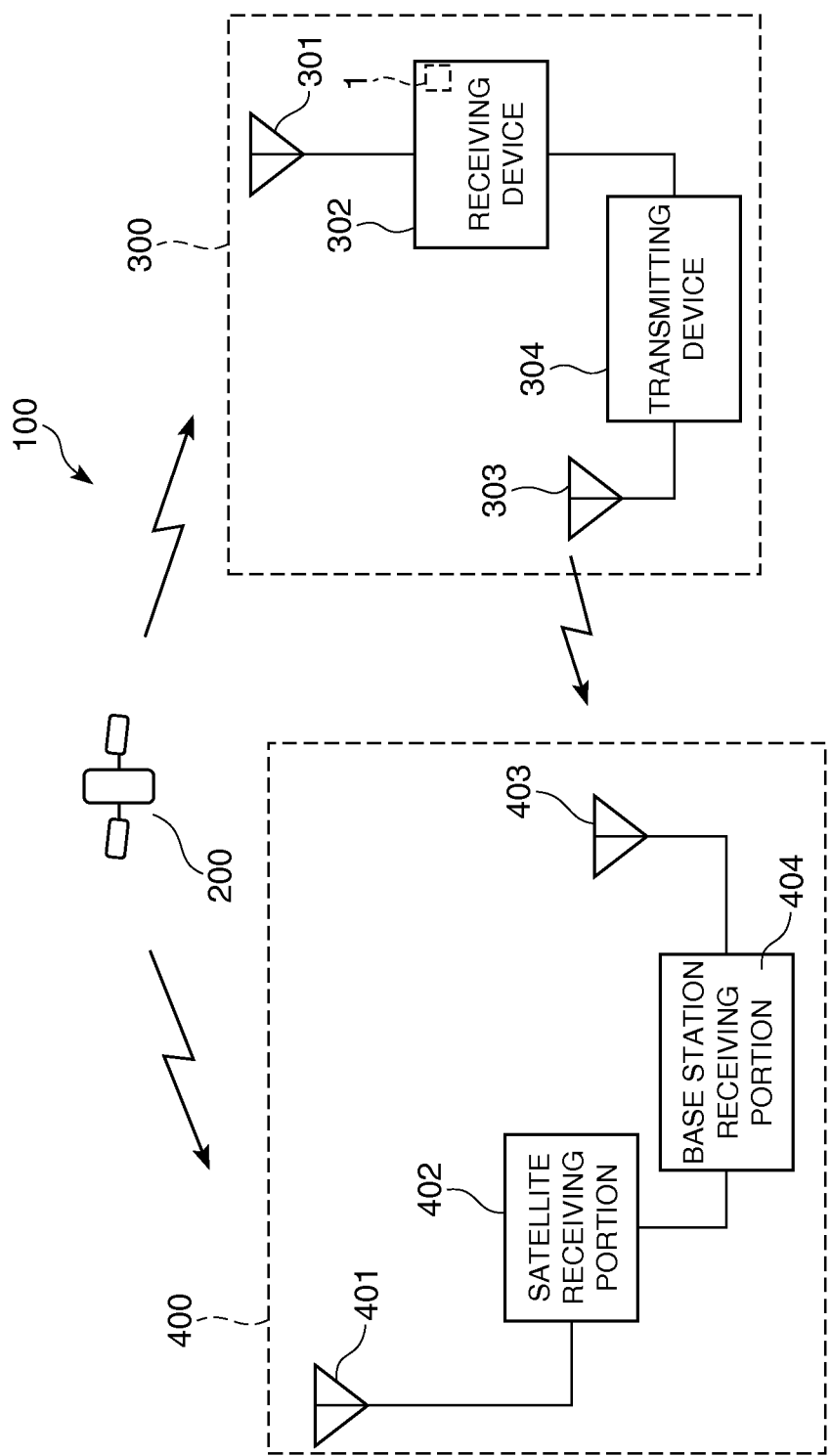
FIG. 15 is a schematic diagram of a system configuration in a case of using the atomic oscillator of the invention in a positioning system using a GPS satellite.

FIG. 15 is a system configuration schematic diagram of a case of using the atomic oscillator according to the invention in positioning system using a GPS satellite.

A positioning system 100 shown in FIG. 15 includes a GPS satellite 200, a base station apparatus 300, and a GPS receiving apparatus 400.

The GPS satellite 200 receives positioning information (a GPS signal).

The base station apparatus 300 includes, for example, a receiving apparatus 302 which accurately receives the positioning information from the GPS satellite 200 via an antenna 301 provided in an electronic reference point (a GPS continuous observation station), and a transmitting apparatus 304 which transmits the positioning information received from the receiving apparatus 302 via an antenna 303.

Herein, the receiving apparatus 302 is an electronic apparatus which includes the atomic oscillator 1 according to the invention mentioned above as a reference frequency oscillation source. The receiving apparatus 302 has excellent reliability. Furthermore, the positioning information received by the receiving apparatus 302 is transmitted by the transmitting apparatus 304 in real time.

The GPS receiving apparatus 400 includes a satellite receiving portion 402 which the positioning information from the GPS satellite 200 via an antenna 401, and a base station receiving portion 404 which receives the positioning information from the base station apparatus 300 via an antenna 403.

As mentioned above, the gas cell unit, the atomic oscillator, and the electronic apparatus according to the invention have been described based on the shown embodiments, but the invention is not limited thereto.

Furthermore, in the gas cell unit and the atomic oscillator according to the invention, the configurations of each portion can be substituted for an arbitrary configuration exhibiting the same function, and an arbitrary configuration can also be added.

Furthermore, in the gas cell unit and the atomic oscillator according to the invention, arbitrary configurations of the respective embodiments mentioned above may be combined with each other.

For example, in the embodiment mentioned above, a case has been described where two heaters (the first heater and the second heater) included in the gas cell unit have the same configuration, but in a case where the gas cell unit has two heaters, one heater and the other heater may have different configurations.

Furthermore, any one of the heaters 22 and 23 may be omitted depending on the size of the gas cell 21, the type of the used alkali metal, the heating amount of the heater or the like. Furthermore, the number of heaters included in the gas cell unit may be three, or five or more.

Furthermore, in the embodiment mentioned above, a case has been described where two temperature sensors are provided, but the number of the temperature sensors may be one, or three or more.

The entire disclosure of Japanese Patent Application No. 2011-055657, filed Mar. 14, 2011 is expressly incorporated by reference herein.

What is claimed is:

1. A gas cell unit comprising:
a gas cell;
a first heater which heats the gas cell; and
a second heater which heats the gas cell, wherein
each of the first and second heaters includes a first band-like portion and a second band-like portion provided parallel to each other and a configuration in which the first band-like portion and the second band-like portion are connected to each other,
a direction of electric current flowing through the first band-like portion is opposite to a direction of electric current flowing through the second band-like portion, and the gas cell unit has a configuration in which the gas cell is interposed between the first heater and the second heather.

2. The gas cell unit according to claim 1, wherein the first heater or the second heater has a plurality of the first band-like portions and the second band-like portions, and the first band-like portions and the second band-like portions are alternately arranged.

3. The gas cell unit according to claim 2, wherein a shape of the configuration, in which the first band-like portion and the second band-like portion are connected to each other, forms a serpentine shape.

4. An atomic oscillator comprising:
the gas cell unit according to claim 1;
a light emitting portion which emits an excitation light exciting an alkali metal atom in the gas cell; and
a light detecting portion which detects an intensity of the excitation light transmitted through the gas cell.

5. An electronic apparatus which includes the atomic oscillator according to claim 4.

6. A gas cell unit comprising:
a gas cell; and
a first heater which heats the gas cell, wherein
the first heater includes a first band-like portion and a second band-like portion provided parallel to each other and a configuration in which the first band-like portion and the second band-like portion are connected to each other,
a direction of electric current flowing through the first band-like portion is opposite to a direction of electric current flowing through the second band-like portion, and
the first band-like portion and the second band-like portion are film-like heating resistors.

7. The gas cell unit according to claim 6, wherein the first band-like portion and the second band-like portion are bonded onto an insulating substrate provided separately from the gas cell.

8. The gas cell unit according to claim 6, wherein the first band-like portion and the second band-like portion are bonded to an outer surface of the gas cell.

* * * * *